United States Patent
Liu

(10) Patent No.: US 10,520,543 B2
(45) Date of Patent: Dec. 31, 2019

(54) TEST STRUCTURE AND METHOD FOR JUDGING DE-EMBEDDING ACCURACY OF RF DEVICES BY USING AN INTRODUCED DEVICE

(71) Applicants: SHANGHAI IC R&D CENTER CO., LTD., Shanghai (CN); CHENGDU IMAGE DESIGN TECHNOLOGY CO., LTD., Chengdu (CN)

(72) Inventor: Linlin Liu, Shanghai (CN)

(73) Assignees: SHANGHAI IC R&D CENTER CO., LTD, Shanghai (CN); CHENGDU IMAGE DESIGN TECHNOLOGY CO., LTD., Chengdu (CN)

( * ) Notice: Subject to any disclaimer, the term of this patent is extended or adjusted under 35 U.S.C. 154(b) by 440 days.

(21) Appl. No.: 15/511,246

(22) PCT Filed: Oct. 28, 2014

(86) PCT No.: PCT/CN2014/089677
§ 371 (c)(1),
(2) Date: Mar. 15, 2017

(87) PCT Pub. No.: WO2016/065531
PCT Pub. Date: May 6, 2016

(65) Prior Publication Data
US 2017/0285098 A1    Oct. 5, 2017

(51) Int. Cl.
*G01R 31/28* (2006.01)

(52) U.S. Cl.
CPC ..... *G01R 31/2822* (2013.01); *G01R 31/2818* (2013.01)

(58) Field of Classification Search
CPC ................. G01R 31/2822; G01R 31/2818
See application file for complete search history.

(56) References Cited

U.S. PATENT DOCUMENTS

| 6,211,541 B1 * | 4/2001 | Carroll ............... H01L 23/66 257/275 |
| 7,954,080 B2 * | 5/2011 | Yen ................. H01L 22/34 716/136 |

(Continued)

*Primary Examiner* — Hyun D Park
(74) *Attorney, Agent, or Firm* — Tianchen LLC.; Yuan R. Li; Yi Fan Yin

(57) ABSTRACT

The present invention discloses a test structure and a method for judging the de-embedding accuracy of RF devices, which comprises testing the S parameters of a target device test structure, an introduced device test structure and an auxiliary test structure, respectively. Then calculating de-embedding S parameters of the target device test structure and the introduced device test structure according to the above-tested results, respectively. Finally, calculating performance parameters of the target device test structure according to the above-calculated de-embedding S parameters. So, the accuracy of the de-embedding method is determined by comparing the consistency of the performance parameters. The present invention can directly judge the de-embedding accuracy and the applicable frequency range of a given de-embedding method by analyzing the testing data. Further, the using of the parallel test structure and the cascade test structure together can increase the reliability of the judgment results.

12 Claims, 4 Drawing Sheets

(56) References Cited

U.S. PATENT DOCUMENTS

| | | | |
|---|---|---|---|
| 2011/0254576 A1* | 10/2011 | Cho | G01R 31/2846 324/756.01 |
| 2015/0057980 A1* | 2/2015 | Groves | G01R 27/28 702/191 |

* cited by examiner

TEST STRUCTURE AND METHOD FOR JUDGING DE-EMBEDDING ACCURACY OF RF DEVICES BY USING AN INTRODUCED DEVICE

CROSS-REFERENCE TO RELATED APPLICATION

This application claims the priority benefit of PCT patent application Ser. No. PCT/CN2014/089677, filed Oct. 28, 2014. The entirety of each of the above-mentioned patent applications are hereby incorporated by reference herein and made a part of the specifications.

FIELD OF THE INVENTION

The present invention relates to a test field of semiconductor devices. More specifically, it relates to a test structure and method for judging de-embedding accuracy of RF devices by using an introduced device.

BACKGROUND OF THE INVENTION

An integrated circuit formed on a semiconductor substrate includes a plurality of active and passive components, such as resistors, inductors, capacitors, transistors, amplifiers, and so on. The above components are manufactured in accordance with a design specification that defines an ideal physical or electrical characteristics (e.g., resistance, inductance, capacitance, gain, etc.) of the components. In general, some components cannot be confirmed to meet their design specifications after they are integrated into the integrated circuit, although they are expected to be confirmed. In other words, a stand-alone copy of each of the components above-mentioned is independently manufactured on a wafer by using the same processes as it is manufactured in the integrated circuit, which has the same physical/electrical characteristics as it is in the integrated circuit. And it is assumed that the physical/electrical characteristics obtained by measuring the stand-alone copy are equivalent to its physical/electrical properties in the integrated circuit.

During the test, the stand-alone copy called a device-under-test (DUT), is electrically connected to leads and test pads. Further, the leads and the test pads are electrically connected to an external test device, e. g., a vector network analyzer (VNA). The VNA can measure various parameters of the DUT characterizing its electrical characteristics, e. g., S parameters (i.e. scattering parameters), Y parameters (i.e. admittance parameters), Z parameters (i.e. impedance parameters), H parameters, and etc. When the DUT is used in high-frequency microwave circuits, the scattering parameters (i.e. S parameters) are usually used to characterize the electrical characteristics of the DUT. However, due to the parasitic effects generated by the leads and the test pads (e. g., resistance values, capacitance values and inductance values of the leads and the test pads) are also contained in the various parameters of the DUT during the test, a de-embedding method is usually utilized to subtract the parasitic effects, so as to obtain the actual electrical characteristics of the DUT.

In order to obtain the real test data of the DUT, a lot of de-embedding methods are proposed, such as an open de-embedding method proposed in the paper of "C. H. CHEN and M. J. DEEN, High frequency Noise of MOSFETs I Modeling. Solid-state Electronics Vol. 42, No. 11, pp. 2069-2081, 1998", and an open-short de-embedding method proposed in the paper of "K. Aufinger and J. Bock, A Straight-forward Noise De-embedding Method and Its Applications to High-Speed Silicon Bipolar Transistors, Proceedings of ESSDERC 96, pp. 957", which are widely used in the prior art. However, the open de-embedding method can only remove the parasitic capacitance of the test pads, while the open-short de-embedding method ignores the parasitic capacitance effect on the noise although it not only can remove the parasitic capacitance of the test pads, but also can remove the parasitic resistance and the parasitic inductance of the metal leads. With the continues decreasing of the device size and the continues increasing of application frequency, the effect of the parasitic capacitance of the metal leads becomes very important. Therefore, an open-thru de-embedding method is proposed by the paper of "C. H. CHEN and M. J. DEEN, A General Procedure for High-Frequency Noise Parameter De-embedding of MOSFETs by Taking the Capacitive Effects of Metal Interconnection into Account, IEEE, Conference on Microelectronic Test Structures, Vol. 14, March 2001" to remove the parasitic capacitance of the metal leads.

More de-embedding methods are further disclosed in china patent publication No.CN100541224, No.CN101943739B, No.CN103063999A, and No. CN13066773B and china patent application No. CN13050479A.

Take the prior open-thru de-embedding method as an example, the de-embedded structure is shown in the FIG. 1, including a DUT structure 1, an open-only de-embedding test structure 2, a first thru-only de-embedding test structure 3A, and a second thru-only de-embedding test structure 3B. Wherein, the DUT structure 1 comprises a RF device 11, a signal input pad S1, a signal output pad S2, and four grounded pads G1, G2, G3 and G4. The signal input pad S1 is connected to an input end of the RF device 11 by a metal lead 12, and the signal output pad S2 is connected to an output end of the RF device 11 by a metal lead 13. The four grounded pads are connected to each other by a metal lead 14, and also connected to the grounded terminal of the RF device 11. The signal input pad S1 and the signal output pad S2 are arranged on a first straight line, and are occupied on two ends of the first straight line. A second straight line and a third straight line are symmetrically arranged on both sides of the first straight line and both are parallel to the first straight line. There are four grounded pads arranged on two ends of the second straight line and the third straight line, respectively. Specifically, the grounded pad G1 and the grounded pad G2 are respectively occupied on two ends of the second straight line, while the grounded pad G3 and the grounded pad G4 are respectively occupied on two ends of the third straight line And the grounded pads G1 and G3 are aligned with the signal input pad S1 in a direction perpendicular to the first straight line, while the grounded pads G2 and G4 are aligned with the signal output pad S2 in a direction perpendicular to the first straight line.

The open-only de-embedding test structure 2 is get by removing the RF device 11 and the metal leads 12 and 13 from the DUT structure 1.

The first thru-only de-embedding test structure 3A is get by removing the RF device 11 from the DUT structure 1. And the signal input pad S1 and the signal output pad S2 are connected together by a metal lead 12a, which has the same length and width with the metal lead 12. The grounded pads G1 and G2 are connected together by a metal lead, and the grounded pads G3 and G4 are connected by another metal lead, while the grounded pads G1 and G2 on the second straight line and the grounded pads G3 and G4 on the third straight line are not connected together.

The second thru-only de-embedding test structure 3B is get by removing the RF device 11 from the DUT structure 1. And the signal input pad S1 and the signal output pad S2 are connected together by a metal lead 13a, which has the same length and width with the metal lead 13. The grounded pads G1 and G2 are connected together by a metal lead, and the grounded pads G3 and G4 are connected by another metal lead, while the grounded pads G1 and G2 on the second straight line and the grounded pads G3 and G4 on the third straight line are not connected together.

Referring to the FIG. 2, which is a flow chart of a de-embedding calculation of a prior open-thru de-embedding method. Firstly, a first scattering parameter $S^{DUT}$ of the DUT structure 1, a second scattering parameter $S^{PAD}$ of the open-only de-embedding test structure 2, a third scattering parameter $S^{THRU1}$ of the first thru-only de-embedding test structure 3A, a forth scattering parameter $S^{THRU2}$ of the second thru-only de-embedding test structure 3B, and noise parameters of the DUT structure 1 are obtained by testing. Wherein, the noise parameters of the DUT structure 1 include a first minimum noise figure $NF_{min}^{DUT}$, a first optimum source impedance $Y_{opt}^{DUT}$ comprised of a real part $G_{opt}$ and an imaginary part $B_{opt}$, and a first equivalent input impedance $R_n^{DUT}$. Secondly, a de-embedding calculation is used to obtain noise parameters of the RF device of the DUT structure 1 according to the above test results of scattering parameters and noise parameters.

Specifically, the prior de-embedding calculation includes the following steps:

Step 1: transferring the second scattering parameter $S^{PAD}$ into a second admittance parameter $Y^{PAD}$ of the open-only de-embedding test structure 2, and further transferring the received second admittance parameter $Y^{PAD}$ into a second ABCD parameter $A^{PAD}$, wherein the formula of the transformation of the second admittance parameter $Y^{PAD}$ into the second ABCD parameter $A^{PAD}$ could refer to $$A^{PAD} = \begin{bmatrix} 1 & 0 \\ Y^{PAD} & 1 \end{bmatrix}$$

shown in the FIG. 3. The RF device shown in the FIG. 3 is a MOSFET device, wherein, the port 1 is an input terminal, which the source is grounded and the gate is signal input end, and the port 2 is an output terminal, which the source is grounded and the drain is the signal output end.

Step 2: transferring the third scattering parameter $S^{THRU1}$ into a third ABCD parameter $A^{THRU1}$ of the first thru-only de-embedding test structure 3A and transferring the forth scattering parameter $S^{THRU2}$ into a forth ABCD parameter $A^{THRU2}$ of the second thru-only de-embedding test structure 3B.

Step 3: calculating an ABCD parameter $A^{IN}$ of the input end of the DUT structure 1 according to an ABCD parameter $A^{THRU1'}$ and the second ABCD parameter $A^{PAD}$, shown in the FIG. 3, wherein the ABCD parameter $A^{THRU1'}$ is the ABCD parameter of the metal lead 12a in the first thru-only de-embedding test structure 3A and is obtained by removing the both second ABCD parameter $A^{PAD}$ from the third ABCD parameter $A^{THRU1}$ of the first thru-only de-embedding test structure 3A. Because the metal lead 12 and metal lead 12a are identical, the ABCD parameter $A^{THRU1'}$ is also equal to the ABCD parameter of the metal lead 12 in the DUT structure 1. Calculating an ABCD parameter $A^{OUT}$ of the output end of the DUT structure 1 according to an ABCD parameter $A^{THRU2'}$ and the second ABCD parameter $A^{PAD}$, wherein the ABCD parameter $A^{THRU2'}$ is the ABCD parameter of the metal lead 13a in the second thru-only de-embedding test structure 3B. Because the metal lead 13 and metal lead 13a are identical, the ABCD parameter $A^{THRU2'}$ is also equal to the ABCD parameter of the metal lead 13 in the DUT structure 1.

Step 4: transferring the first scattering parameter $S^{DUT}$ into a first ABCD parameter $A^{DUT}$ of the DUT structure 1. Further, calculating a fifth ABCD parameter $A^{TRANS}$ of the RF device of the DUT structure 1 according to the first ABCD parameter $A^{DUT}$, the ABCD parameter $A^{IN}$ of the input end and the ABCD parameter $A^{OUT}$ of the output end. And calculating a first correlation matrix $C_A^{DUT}$ according to the minimum noise figure $NF_{min}^{DUT}$, the optimum source impedance $Y_{opt}^{DUT}$ and the equivalent input impedance $R_n^{DUT}$. And calculating a correlation matrix $C_Z^{IN}$ of the input end of the DUT structure 1 according to the ABCD parameter $A^{IN}$ of the input end, and further deriving out a second correlation matrix $C_A^{IN}$. And calculating a correlation matrix $C_Z^{OUT}$ of the output end of the DUT structure 1 according to the ABCD parameter $A^{OUT}$ of the output end, and further deriving out a third correlation matrix $C_A^{OUT}$.

Step 5: calculating a correlation matrix $C_A$ of the RF device according to the input end ABCD parameter $A^{IN}$, the fifth ABCD parameter $A^{TRANS}$, the first correlation matrix $C_A^{DUT}$, the second correlation matrix $C_A^{IN}$, and the third correlation matrix $C_A^{OUT}$. And finally deriving out the noise parameters of the RF device, including a second minimum noise figure $NF_{min}$, a second optimum source impedance $Y_{opt}$, and a second equivalent input impedance $R_n$, according to the correlation matrix $C_A$.

Above methods have improved the accuracy of the de-embedding and increased the frequency range applicable to the de-embedding results.

However, the above-proposed methods are based on the uses of different sub-circuit models to simulate the parasitic factors introduced by the test structure. With the increasing frequency, the simple parasitic element equivalent circuit model is no longer effective at high frequency. Therefore, the corresponding de-embedding strategy is proposed basing on more complex sub-circuit equivalent model. However, the prior technologies mainly focus on the study about the embedded steps of an embedded method and illustrate the progress effect by theoretical analysis, but ignore the evaluation of the de-embedding accuracy and the applicable range.

BRIEF SUMMARY OF THE DISCLOSURE

To overcome the problems as mentioned above, it is an object of the present invention to provide a test structure and method of judging the de-embedding accuracy of RF devices by using an introduced device, which can be applied to different de-embedding methods to judge the de-embedding accuracy and the applicable range of each de-embedding method.

In order to achieve the above object, the present invention provides a test structure for judging the de-embedding accuracy of a RF device by using an introduced device, including a target device test structure D1, an introduced device test structure and a corresponding auxiliary test structure D5, wherein the introduced device test structure includes a reference device test structure D2, a parallel test structure D3 of the target device and the reference device, a cascade test structure D4 of the target device and the reference device; combining the target device test structure D1, the reference device test structure D2, the parallel test structure D3 of the target device and the reference device, the cascade test structure D4 of the target device and the reference device, and the auxiliary test structure D5 to judge the de-embedding accuracy of the RF device.

In order to achieve the above object, the present invention also provides a method for judging the de-embedding accuracy of a RF device by using an introduced device, which is used to judge the accuracy of test performance parameters of the target device obtained by the de-embedding method. The de-embedding accuracy is judged by combination calculations of a target device test structure D1, an introduced device test structure and a corresponding auxiliary test structure D5, wherein the introduced device test structure comprises a reference device test structure D2, a parallel test structure D3 of the target device and the reference device, a cascade test structure D4 of the target device and the reference device; the combination calculations comprise: testing S parameters of the test structures D1~D5; calculating de-embedding S parameters of the test structures D1~D4; calculating test performance parameters of the target device test structure D1 according to the de-embedding S parameters calculated above; and judging the de-embedding accuracy by comparing the consistency of the test performance parameters.

Further, the method comprises the steps of:

Step S01: testing the S parameters of the target device test structure D1, the reference test structure D2, the parallel test structure D3, the cascade test structure D4, and the auxiliary test structure D5, respectively;

Step S02: calculating the de-embedding S parameters of the target device test structure D1, the reference test structure D2, the parallel test structure D3 and the cascade test structure D4 according to the S parameters of the test structures D1-D4 and D5;

Step S031: calculating a first result value X1 of the test performance parameters of the target device according to the above-calculated de-embedding S parameter of the target device test structure D1;

Step S032: calculating a second result value X2 of the test performance parameters of the target device according to the above-calculated de-embedding S parameters of the reference test structure D2 and the parallel test structure D3;

Step S033: calculating a third result value X3 of the test performance parameters of the target device according to the above-calculated de-embedding S parameters of the reference test structure D2 and the cascade test structure D4;

Step S04: obtaining error values by calculating the differences of X1 and X2, X2 and X3, and X1 and X3, and comparing the error values with the preset value to judge the accuracy and the applicable frequency range of the de-embedding method.

Further, the Step S02 also includes converting the S parameters of the test structures D1-D4 and the auxiliary test structure D5 into network parameters of them (e. g., Y parameter, Z parameter, ABCD parameter, and so on), then calculating and removing parasitic factors of the network parameters of the test structures D1-D4, finally, the de-embedding S parameters of the test structures D1, D2, D3, D4 are obtained.

Wherein, since each de-embedding method has corresponding method of removing parasitic factors and calculation method thereof, the above method of removing parasitic factors also comprises: proceeding a proper operation for the received network parameters basing on the de-embedding method being judged and the sub-circuit model used to characterize parasitic factors of the network parameters of the auxiliary test structure thereof, so that removing the parasitic factors.

Further, the Step S031 also includes converting the de-embedding S parameter of the target device test structure D1 into a Y parameter of its, then calculating the first result value X1 of the test performance parameters by the relationship between the converted Y parameter of the target device test structure D1 and the test performance parameters.

Further, the Step S032 also includes converting the de-embedding S parameters of the reference device test structure D2 and the parallel test structure D3 into Y parameters of them, calculating a Y parameter of the target device test structure according to a formula of Y parameters of the target device test structure, the reference device test structure and the parallel test structure in the two-port network interconnection theory, and calculating the second result value X2 of the test performance parameters by the relationship of the calculated Y parameter of the target device test structure and the test performance parameters.

Further, the formula of Y parameters of the target device test structure, the reference device test structure and the parallel test structure in the step S032 is $$Y_{PAR} = Y_1 + Y_2 = \begin{bmatrix} Y_{1,11} + Y_{2,11} & Y_{1,12} + Y_{2,12} \\ Y_{1,21} + Y_{2,21} & Y_{1,22} + Y_{2,22} \end{bmatrix}$$

wherein $Y_{PAR}$ is the Y parameter of the parallel test structure, $Y_1$ is the Y parameter of the target device test structure, and $Y_2$ is the Y parameter of the reference device test structure.

Further, the Step S033 also includes converting the de-embedding S parameters of the reference device test structure D2 and the cascade test structure D4 into ABCD parameters of them, calculating an ABCD parameter of the target device test structure according to a formula of ABCD parameters of the target device test structure, the reference device test structure and the cascade test structure in the two-port network interconnection theory, converting the calculated ABCD parameter of the target device test structure into its Y parameter, and calculating the third result value X3 of the test performance parameters by the relationship of the Y parameter of the target device test structure and the test performance parameters.

Further, the formula of ABCD parameters of the target device test structure, the reference device test structure and the cascade test structure in the Step S033 is:

$$\begin{bmatrix} A_{CAS} & B_{CAS} \\ C_{CAS} & D_{CAS} \end{bmatrix} = \begin{bmatrix} A_1 & B_1 \\ C_1 & D_1 \end{bmatrix} \begin{bmatrix} A_2 & B_2 \\ C_2 & D_2 \end{bmatrix}$$

wherein the subscript CAS indicates the cascade test structure, the subscript 1 indicates the target device test structure, and the subscript 2 indicates the reference device test structure.

Further, the Step S04 also includes that if the minimum error value is lower than the preset value, it is judged that the accuracy and the applicable frequency range of the RF device both are acceptable; if the minimum error value is higher than the preset value, it is judged that the accuracy and applicable frequency range of the RF device both are unacceptable.

Further, the auxiliary test structure D5 includes one or more of an open circuit test structure, a short circuit test structure and a through test structure corresponding to the de-embedding method, the target device test structure, the reference device test structure, the parallel test structure of the target device and the reference device, the cascade test structure of the target device and the reference device, and the auxiliary test structure all have a same basic structure with same signal input and output pads, grounded pads and metal leads.

Further, the target device or the reference device is one of a capacitor, an inductor, a resistor, and a transistor without external bias, respectively.

The present invention is used to judge the accuracy of the test performance parameters of a target device received by one of above mentioned prior de-embedding methods, including the open de-embedding method, the open-short de-embedding method, the open-thru de-embedding method and open-short-thru de-embedding method, and the applicable frequency range thereof.

The present invention has provided a test structure and method for judging de-embedding accuracy of a RF device by using an introduced device. Through introducing additional test structures, i.e. a reference device test structure, a parallel test structure of the target device and the reference device test structure and a cascade test structure of the target device and the reference device test structure, the de-embedding accuracy and the applicable frequency range of a given de-embedding method can be directly judged from the received testing results basing on the various test structures. In addition, the use of the parallel test structure and the cascade test structure has improved the reliability of the judgment result. The present invention is suitable for passive RF devices and active devices under zero bias, and also suitable for different de-embedding methods in the prior art. Since the system de-embedding error caused by different embedding methods may be amplified or reduced by one interconnect structure, two cascade and parallel interconnects independent each other are employed at the same time in the present invention. Accordingly, the system de-embedding error is participated in different propagation paths, that is, different logic calculations, therefore, the received result will be more reliable than that using a single interconnect structure.

BRIEF DESCRIPTION OF THE DRAWINGS

For a better understanding of the objects, features and advantages of the present invention, preferred embodiments of the present invention will be described in detail below with reference to the accompanying drawings in which.

DETAILED DESCRIPTION OF THE EMBODIMENTS

Figure 1:
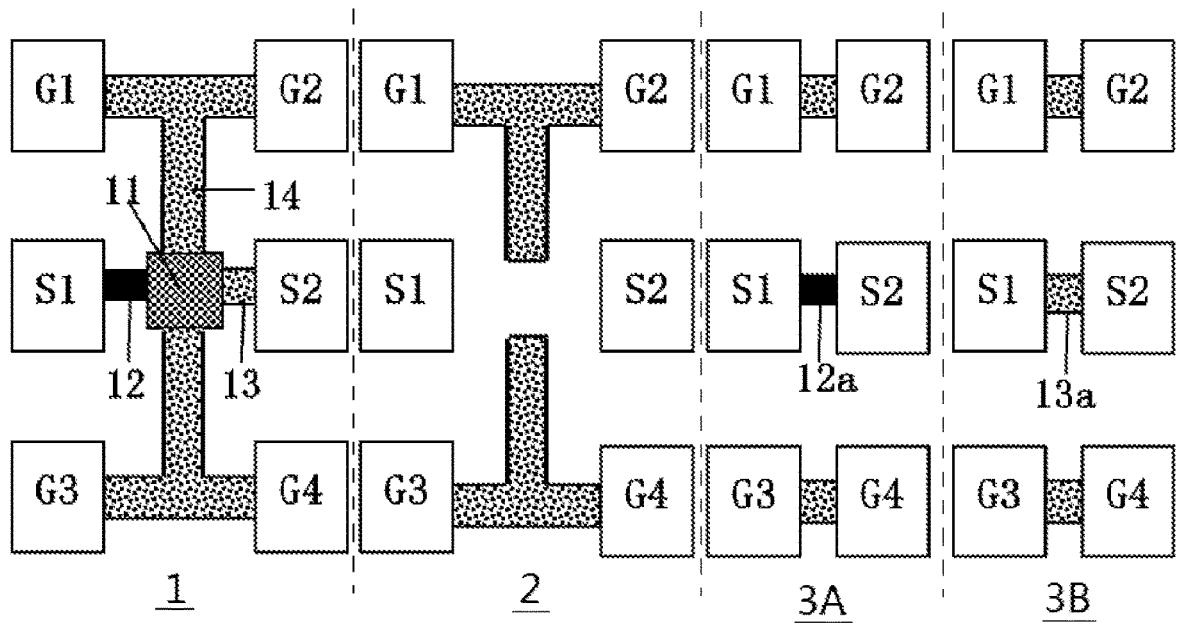
FIG. 1 is a schematic view illustrating a de-embedding structure of a prior open-thru de-embedding method.
Figure 2:
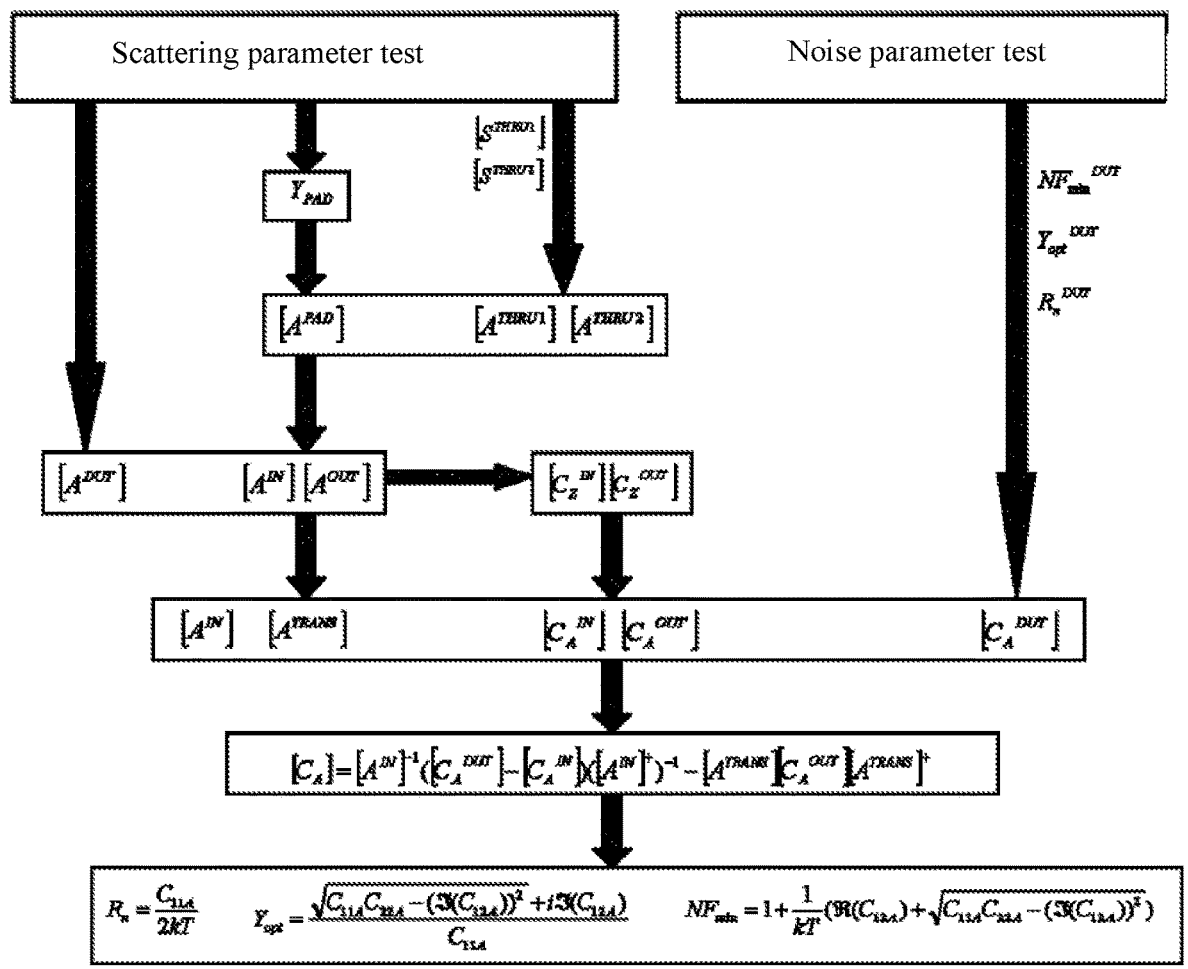
FIG. 2 is a flow chart illustrating a de-embedding calculation method of a prior open-thru de-embedding method.
Figure 3:
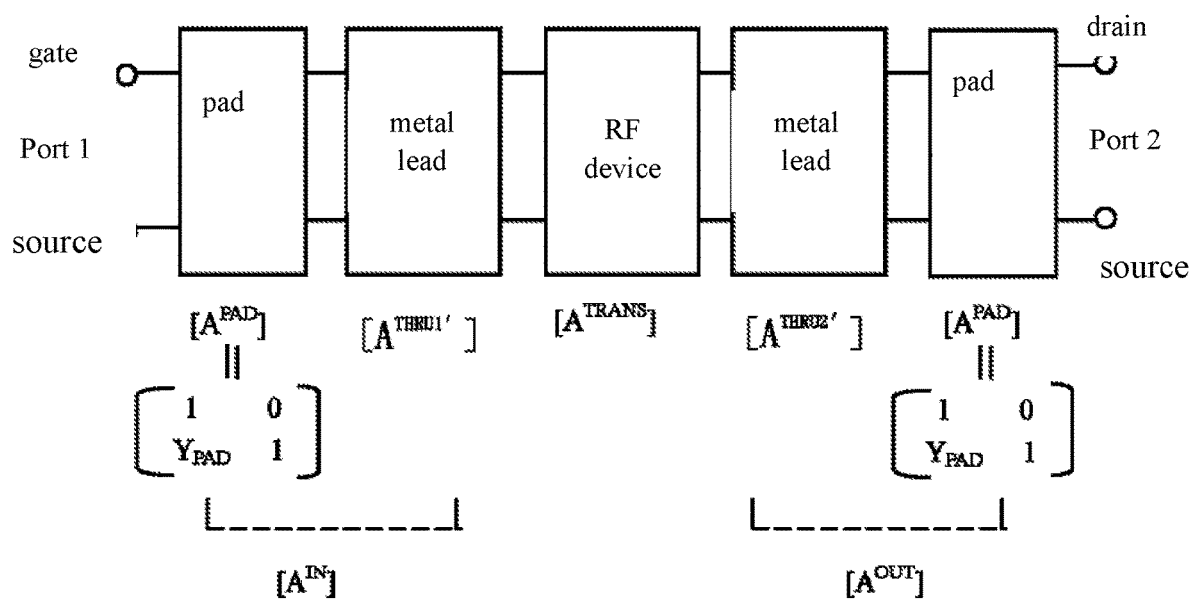
FIG. 3 is a block diagram illustrating a DUT structure in a de-embedding calculation of the prior art.
Figure 4:
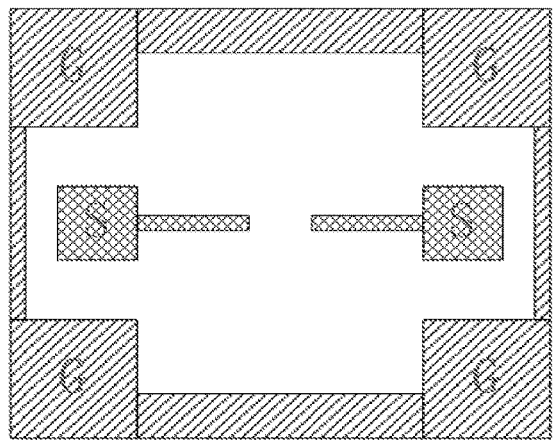
FIG. 4 is a schematic view illustrating an open circuit test structure according to a first embodiment of the present invention.
Figure 5:
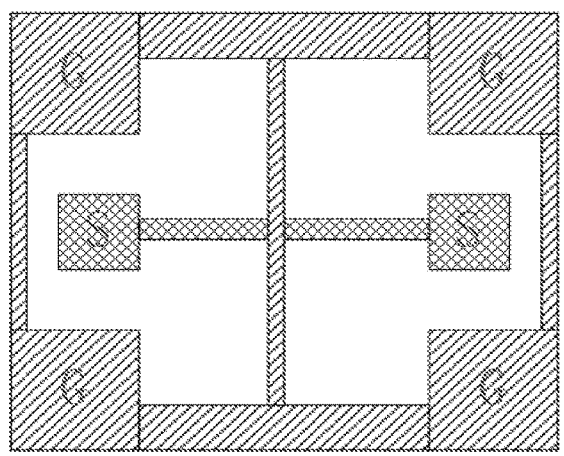
FIG. 5 is a schematic view illustrating a short circuit test structure according to a first embodiment of the present invention.
Figure 6:
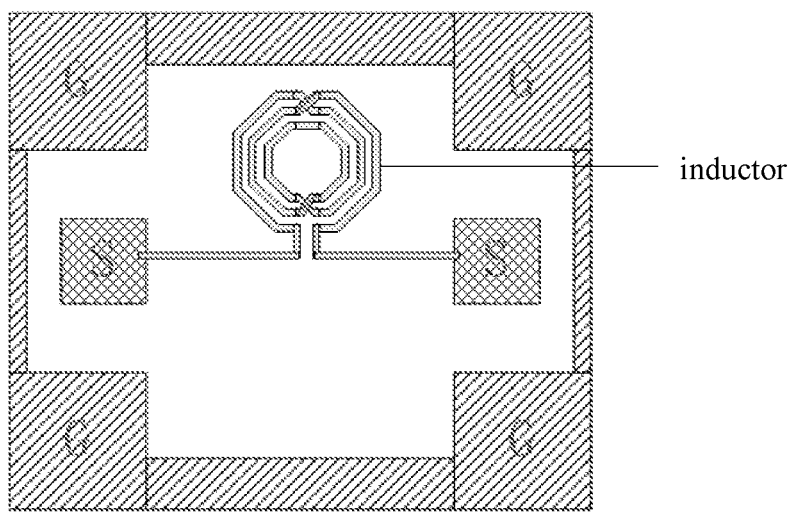
FIG. 6 is a schematic view illustrating an inductance test structure according to a first embodiment of the present invention.
Figure 7:
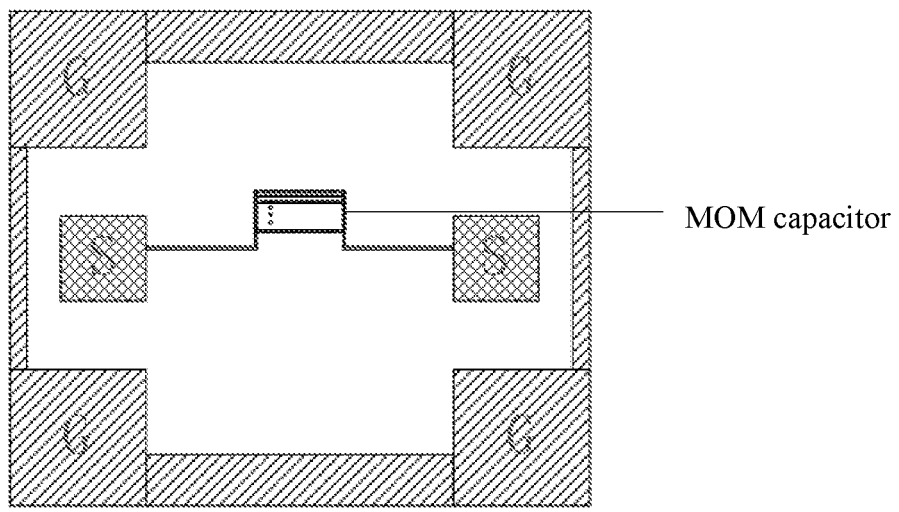
FIG. 7 is a schematic view illustrating a MOM capacitance test structure according to a first embodiment of the present invention.
Figure 8:
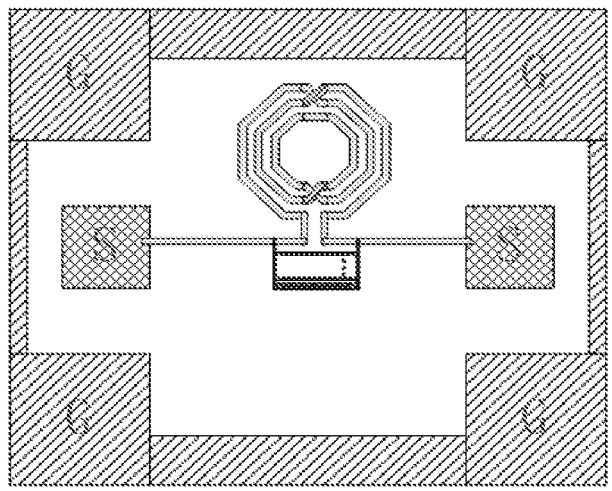
FIG. 8 is a schematic view illustrating a parallel test structure of capacitor and inductor according to a first embodiment of the present invention.
Figure 9:
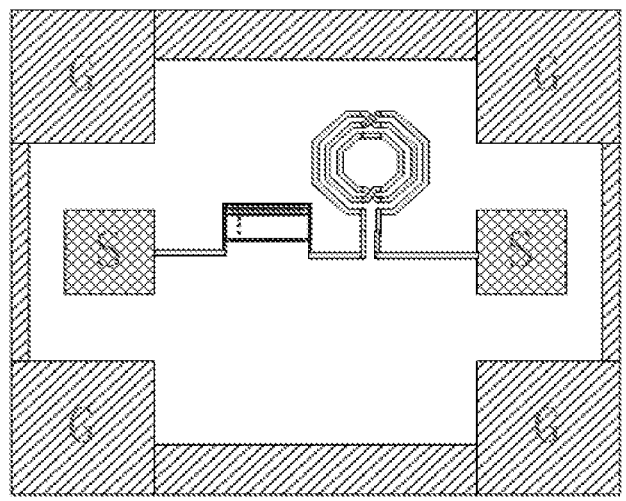
FIG. 9 is a schematic view illustrating a cascade test structure of capacitor and inductor according to a first embodiment of the present invention.

A test structure and method for judging de-embedding accuracy of the RF device by using an introduced device is disclosed in the present invention, which is aimed on judging the de-embedding accuracy of one or more of the test performance parameters for a target device. Through introducing additional test structures, i.e. a reference device test structure, e. g., inductance, capacitance, resistance, and etc., a parallel test structure of the reference test structure and the target device and a cascade test structure of the reference test structure and the target device, the de-embedding accuracy and the applicable frequency range of a given de-embedding method can be directly judged from the received testing results basing on the various test structures.

The test structure of the present invention includes a target device test structure D1, an introduced device test structure and a corresponding auxiliary test structure D5, wherein the introduced device test structure includes a reference device test structure D2, a parallel test structure D3 of the target device and the reference device, a cascade test structure D4 of the target device and the reference device. Combining the target device test structure D1, the reference device test structure D2, the parallel test structure D3 of the target device and the reference device, the cascade test structure D4 of the target device and the reference device, and the auxiliary test structure D5 to judge the de-embedding accuracy of the RF device.

The method of the present invention characterized that the de-embedding accuracy is judged by combination calculations of a target device test structure D1, an introduced device test structure and a corresponding auxiliary test structure D5, wherein the introduced device test structure comprises a reference device test structure D2, a parallel test structure D3 of the target device and the reference device, a cascade test structure D4 of the target device and the reference device; the combination calculations comprise: testing S parameters of the test structures D1~D5; calculating de-embedding S parameters of the test structures D1~D4; calculating test performance parameters of the target device test structure D1 according to the de-embedding S parameters calculated above; and judging the de-embedding accuracy by comparing the consistency of the test performance parameters. Wherein the test performance parameters of the target device D1 can be calculated basing on the de-embedding S parameters, specifically, including the de-embedding S parameter of the target device test structure D1 and the de-embedding S parameter of the introduced device test structure.

Specifically, the method comprises the steps of:

Step S01: testing the S parameters of the target device test structure D1, the reference test structure D2, the parallel test structure D3, the cascade test structure D4, and the auxiliary test structure D5, respectively;

Step S02: calculating the de-embedding S parameters of the target device test structure D1, the reference test structure D2, the parallel test structure D3 and the cascade test structure D4 according to the S parameters of the test structures D1-D4 and D5;

Step S031: calculating a first result value X1 of the test performance parameters of the target device according to the above-calculated de-embedding S parameter of the target device test structure D1;

Step S032: calculating a second result value X2 of the test performance parameters of the target device according to the above-calculated de-embedding S parameters of the reference test structure D2 and the parallel test structure D3;

Step S033: calculating a third result value X3 of the test performance parameters of the target device according to the above-calculated de-embedding S parameters of the reference test structure D2 and the cascade test structure D4;

Step S04: obtaining error values by calculating the differences of X1 and X2, X2 and X3, and X1 and X3, and comparing the error values with the preset value to judge the accuracy and the applicable frequency range of the de-embedding method.

In the present invention, the above-mentioned target device test structure, the reference device test structure, the parallel test structure of the target device and the reference device, the cascade test structure of the target device and the reference device, and the auxiliary test structure preferably have a same basic structure with same signal input and output pads (S), grounded pads (G) and metal leads.

The following first embodiment takes the open-short de-embedding method widely used in the industry as an example, not limited to this, and uses an inductor device as the target device to judge the de-embedding accuracy of the performance parameters of the inductor device. In this embodiment, a MOM capacitor device is used as a reference device, and an open- circuit test structure and a short-circuit test structure are used as the auxiliary test structures, and a GSG (ground-signal-ground) structure is used to measure the S parameters. The present invention can be suitable to any de-embedding method in the prior arts, wherein, the target device and the reference device, which can be the same or different, may also be other reasonable devices commonly used in the field, such as some passive devices, e. g. capacitors, inductors, and resistors, and some active devices without external bias, e. g. transistor without external bias. And according to different de-embedding methods, the auxiliary test structure can also be replaced by such as an open test structure in the open de-embedding method, or an open test structure, a short test structure and a through test structure in the open-short-thru de-embedding method. The test structure can also be replaced by GS and GSGSG structures.

The First Embodiment

Figure 10:
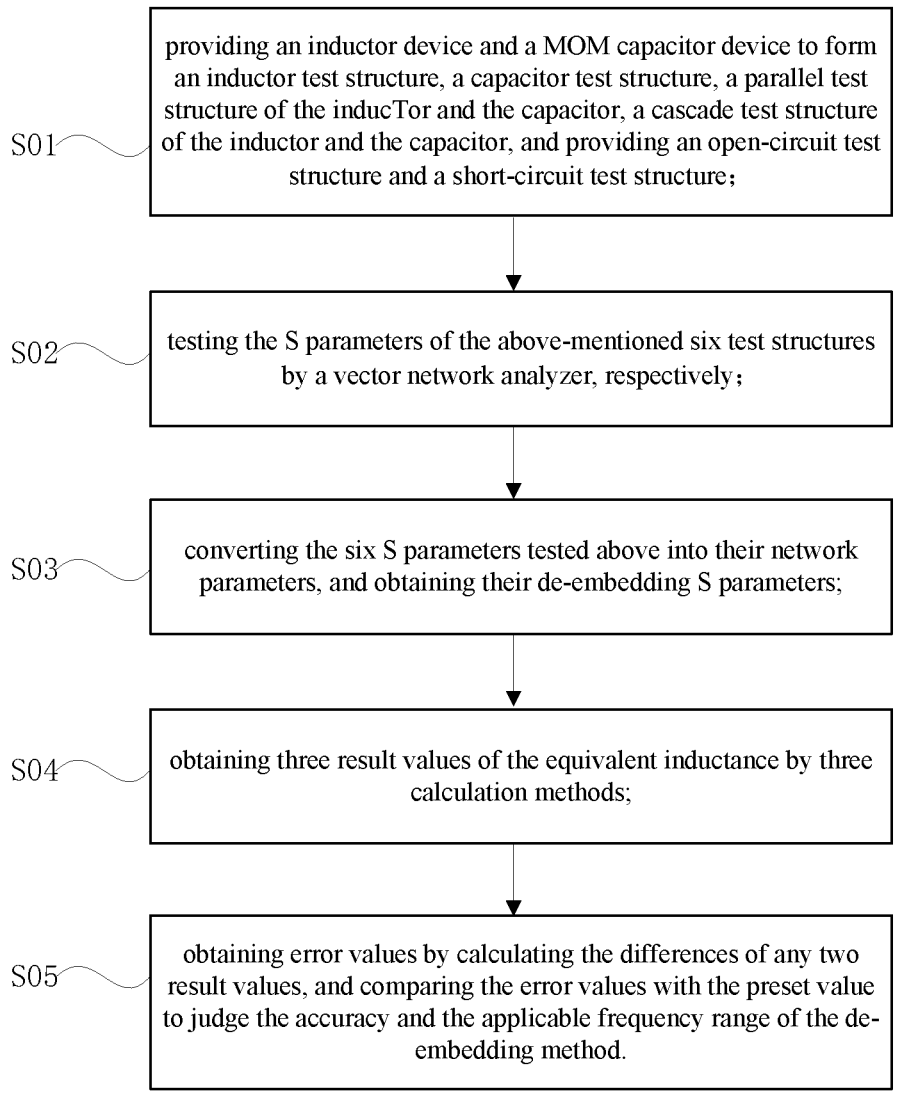
FIG. 10 is a flow chart illustrating a method of judging the de-embedding accuracy of a RF device by using an introduced device according to a first embodiment of the present invention.

Referring to the FIG. 10, and in conjunction with reference to FIGS. 4-9, the method of judging the de-embedding accuracy of a RF device by using an introduced device is comprised of the steps:

Step S01: providing an inductor device and a MOM capacitor device to form an inductor test structure (FIG. 6), a capacitor test structure (FIG. 7), a parallel test structure of the inductor and the capacitor (FIG. 8), a cascade test structure of the inductor and the capacitor (FIG. 9), and providing an open-circuit test structure (FIG. 4) and a short-circuit test structure (FIG. 5) as the auxiliary test structure in the open-short de-embedding method.

Step S02: testing the S parameters (scattering parameters) of the above-mentioned six test structures by a vector network analyzer, respectively, i.e. a S parameter $S_{DUT1}$, of the inductor test structure, a S parameter $S_{DUT2}$, of the capacitor test structure, a S parameter $S_{open}$ of the open-circuit test structure, a S parameter $S_{short}$ of the short-circuit test structure, a S parameter $S_{LCpar}$ of the parallel test structure and a S parameter $S_{LCser}$ of the cascade test structure.

Step S03: converting the six S parameters tested above into their network parameters, then calculating and removing parasitic factors of the network parameters of the inductor test structure, the capacitor test structure, the parallel test structure and the cascade test structure, finally, the de-embedding S parameters of the above four test structures are obtained.

Specifically, converting above six S parameters into their Y parameters (admittance parameters), including a Y parameter $Y_{DUT1}$ of the inductor test structure, a Y parameter $Y_{DUT2}$ of the capacitor test structure, a Y parameter $Y_{open}$ of the open-circuit test structure, a Y parameter $Y_{short}$ of the short-circuit test structure, a Y parameter $Y_{LCpar}$ of the parallel test structure and a Y parameter $Y_{LCser}$ of the cascade test structure.

Then, the Z parameters (impedance parameters) of the inductor test structure, the capacitor test structure, the parallel test structure and the cascade test structure are obtained by using the conventional open-short de-embedding method. Specifically, the inductor test structure is taken as an example, according to above-obtained Y parameters $$Y_{DUT1\text{-}open}=Y_{DUT1}-Y_{open}\ Y_{short\text{-}open}=Y_{short}-Y_{open}$$

then transfer $Y_{DUT1\text{-}open}$ and $Y_{short\text{-}open}$ into $Z_{DUT1\text{-}open}$ and $Z_{short\text{-}open}$, the exact Z parameter of the inductor device is obtained by subtracting $Z_{DUT1\text{-}open}$ and $Z_{short\text{-}open}$ $$Z_L=Z_{DUT1\text{-}open}-Z_{short\text{-}open}$$

finally, transfer the $Z_L$ parameter into its S parameter, i.e., $S_L$, which is the exact de-embedding S parameter of the inductor device obtained by the de-embedding method. The above calculation method is also suitable to the capacitor test structure, the parallel test structure and the cascade test structure. Therefore, the de-embedding S parameter $S_C$ of the capacitor test structure, the de-embedding S parameter $S_{LCpar}$ of the parallel test structure, and the de-embedding S parameter $S_{LCser}$ of the cascade test structure are also obtained.

According to the two-port network interconnection theory, when two two-port networks are connected in parallel, the below relationship is obtained, that is $$[Y]=[Y'+Y'']=\begin{bmatrix} Y'_{11}+Y''_{11} & Y'_{12}+Y''_{12} \\ Y'_{21}+Y''_{21} & Y'_{22}+Y''_{22} \end{bmatrix} \quad (1)$$

and when two two-port networks are connected in cascade, the below relationship is obtained, that is $$\begin{bmatrix} A & B \\ C & D \end{bmatrix}=\begin{bmatrix} A' & B' \\ C' & D' \end{bmatrix}\begin{bmatrix} A'' & B'' \\ C'' & D'' \end{bmatrix} \quad (2)$$

Assuming the de-embedding is ideal, there should have an equation, that is $$[Y_{LCpar}] = [Y_L + Y_C] = \begin{bmatrix} Y_{L11} + Y_{C11} & Y_{L12} + Y_{C12} \\ Y_{L21} + Y_{C21} & Y_{L22} + Y_{C22} \end{bmatrix} \quad (3)$$

and $$\begin{bmatrix} A_{LCser} & B_{LCser} \\ C_{LCser} & D_{LCser} \end{bmatrix} = \begin{bmatrix} A_L & B_L \\ C_L & D_L \end{bmatrix} \begin{bmatrix} A_C & B_C \\ C_C & D_C \end{bmatrix} \quad (4)$$

Where $Y_{LCpar}$, $Y_L$, and $Y_C$ are the de-embedding Y parameters of the parallel test structure, the inductor test structure, and the capacitor test structure, respectively. And $A_{LCser}$, $A_L$, and $A_C$ are the de-embedding ABCD parameters of the cascade test structure, the inductor test structure, and the capacitor test structure, respectively.

The formulas (3) and (4) can be used to judge the de-embedding accuracy and the applicable frequency range. Further, more intuitively, the above formulas (3) and (4) can be transformed into formulas having performance parameters of the inductor (or the capacitor), e. g., the equivalent inductance $L_{11}$ and the quality factor $Q_{11}$ of the first port of the inductor, etc. (the Multiple performance parameters can be used at the same time). There is $$L_{11} = \frac{\operatorname{imag}(1/Y_{11})}{w}, \ L_{22} = \frac{\operatorname{imag}(1/Y_{22})}{w} \quad (5)$$

$$Q_{11} = -\frac{\operatorname{imag}(Y_{11})}{\operatorname{real}(Y_{11})}, \ Q_{22} = -\frac{\operatorname{imag}(Y_{22})}{\operatorname{real}(Y_{22})}$$

Thus, there are three ways in which the equivalent inductance is obtained. Correspondingly, three different results of the equivalent inductance can be obtained. Through calculating the error value of the three equivalent inductances, the de-embedding accuracy and the applicable frequency range of the de-embedding method of the present embodiment are judged. Specifically, the Step S04 also includes:

Step S041: converting the de-embedding S parameter $S_L$ of the inductor test structure into its Y parameter $Y_{11}$, and obtaining the first result value $L_{11}$ of the equivalent inductance of the inductor by substituting $Y_{11}$ into the formula (5).

Step S042: converting the de-embedding S parameter $S_C$ of the capacitor test structure and the de-embedding S parameter $S_{LCpar}$ of the parallel test structure into their Y parameters $Y_C$ and $Y_{LCpar}$; and then obtaining the Y parameter $Y_L$ of the inductor according to the formula (3) based on the two-port network interconnection theory; finally, obtaining the second result value $L_{11\_par}$ of the equivalent inductance of the inductor according to the formula (5).

Step S043: converting the de-embedding S parameter $S_C$ of the capacitor test structure and the de-embedding S parameter $S_{LCpar}$ of the cascade test structure in to their ABCD parameters $A_C$ and $L_{LCser}$; and then obtaining the ABCD parameter $A_L$ of the inductor according to the formula (4) based on the two-port network interconnection theory; finally, obtaining the third result value $L_{11\_ser}$ of the equivalent inductance of the inductor according to the formula (5).

Step S05: obtaining error values by calculating the differences of the obtained $L_{11}$ and $L_{11\_par}$, $L_{11\_par}$ and $L_{11\_ser}$, and $L_{11}$ and $L_{11\_ser}$, and comparing the error values with the preset value to judge the accuracy and the applicable frequency range of the de-embedding method.

Specifically, error values is calculated by the following formula, that is $$\Delta_1 = |L_{11} - L_{11\_par}|$$

$$\Delta_2 = |L_{11} - L_{11\_ser}|$$

$$\Delta_3 = |L_{11\_ser} - L_{11\_par}|$$

$$\Delta = \min(\Delta_1, \Delta_2, \Delta_3)$$

The minimum error value can be obtained. If the minimum error is lower than the preset relative error threshold, it is judged that the accuracy and the applicable frequency range of the de-embedding method both are acceptable; if the minimum error is higher than the preset relative error threshold, it is judged that the accuracy and applicable frequency range of the de-embedding method both are unacceptable.

In other embodiments, there are other methods of judging the consistency of the three results to measure the accuracy of the embedded method, such as relative error, percentage error, etc., not limited to the absolute error of this embodiment.

In the practical application, there are a lot of de-embedding methods, including the open de-embedding method, the open-short de-embedding method, the open-thru de-embedding method, the open-short-thru de-embedding method, and etc. So, the Step S01 also includes building test structures corresponding to the used de-embedding method, e. g., one or more of an open-circuit test structure, a short-circuit test structure and a through test structure. The Step S02 also includes testing the S parameters of the test structures corresponding to the used de-embedding method, e. g., one or more of S parameters of the open-circuit test structure, the short-circuit test structure and the through test structure.

It should be noted that for other de-embedding methods, e.g., the open de-embedding method, the open-thru de-embedding method, and the open-short-thru de-embedding method, the corresponding auxiliary test structures and the corresponding formulas are used to calculate the S parameters and the network parameters, and then the corresponding sub-circuit model characterizing parasitic factors of one de-embedding method is used to calculate the de-embedding S parameters according to the above-received network parameters, so as to remove the corresponding parasitic factors of one de-embedding method. Wherein, the used calculation methods and formulas may have been obtained by the skilled person in the field by referring the prior art or the present invention, so will not be described again.

In the practical application, the target device and the introduced device, which can be the same or not, may be one of resistors, inductors, capacitors, transistors without external bias, respectively. The present invention is suitable to the all above-mentioned devices to judge the de-embedding accuracy and the applicable frequency range of a certain de-embedding method.

In the practical application, interconnection leads in the multi-device interconnect structure should be minimized to reduce errors introduced by interconnecting multiple devices. In order to facilitate testing and to ensure the accuracy of the test, all test structures have a same basic structure, i.e., with the same signal input and output pads, ground pads and metal leads.

The invention claimed is:

1. A method for judging the de-embedding accuracy of a RF device by using an introduced device, comprising the following steps:

Step S00: providing a target device test structure D1 for the RF device, an introduced device test structure and a corresponding auxiliary test structure D5, wherein the introduced device test structure comprises a reference device test structure D2, a parallel test structure D3 of the target device and the reference device, a cascade test structure D4 of the target device and the reference device;

Step S01: testing the S parameters of the target device test structure D1, the reference test structure D2, the parallel test structure D3, the cascade test structure D4, and the auxiliary test structure D5, respectively;

Step S02: calculating the de-embedding S parameters of the target device test structure D1, the reference test structure D2, the parallel test structure D3 and the cascade test structure D4 according to the S parameters of the test structures D1-D4 and D5;

Step S031: calculating a first result value X1 of the test performance parameters of the target device according to the above-calculated de-embedding S parameter of the target device test structure D1;

Step S032: calculating a second result value X2 of the test performance parameters of the target device according to the above-calculated de-embedding S parameters of the reference test structure D2 and the parallel test structure D3;

Step S033: calculating a third result value X3 of the test performance parameters of the target device according to the above-calculated de-embedding S parameters of the reference test structure D2 and the cascade test structure D4;

Step SO4: obtaining error values by calculating the differences of X1 and X2, X2 and X3, and X1 and X3, and comparing the error values with the preset value to judge the accuracy and the applicable frequency range of the de-embedding method.

2. The method according to claim 1, wherein, the Step SO2 also includes converting the S parameters of the test structures D1-D4 and the auxiliary test structure D5 into network parameters of them, then calculating and removing parasitic factors of the network parameters of the test structures D1-D4, finally, the de-embedding S parameters of the test structures D1, D2, D3, D4 are obtained.

3. The method according to claim 1, wherein, the Step S031 also includes converting the de-embedding S parameter of the target device test structure D1 into a Y parameter of its, then calculating the first result value X1 of the test performance parameters by the relationship between the converted Y parameter of the target device test structure D1 and the test performance parameters.

4. The method according to claim 1, wherein, the Step S032 also includes converting the de-embedding S parameters of the reference device test structure D2 and the parallel test structure D3 into Y parameters of them, calculating a Y parameter of the target device test structure according to a formula of Y parameters of the target device test structure, the reference device test structure and the parallel test structure in the two-port network interconnection theory, and calculating the second result value X2 of the test performance parameters by the relationship of the calculated Y parameter of the target device test structure and the test performance parameters.

5. The method according to claim 4, wherein, the formula of Y parameters of the target device test structure, the reference device test structure and the parallel test structure in the step S032 is $$Y_{PAR} = Y_1 + Y_2 = \begin{bmatrix} Y_{1,11} + Y_{2,11} & Y_{1,12} + Y_{2,12} \\ Y_{1,21} + Y_{2,21} & Y_{1,22} + Y_{2,22} \end{bmatrix}$$

wherein $Y_{PAR}$ is the Y parameter of the parallel test structure, $Y_1$ is the Y parameter of the target device test structure, and $Y_2$ is the Y parameter of the reference device test structure.

6. The method according to claim 1, wherein, the Step S033 also includes converting the de-embedding S parameters of the reference device test structure D2 and the cascade test structure D4 into ABCD parameters of them, calculating an ABCD parameter of the target device test structure according to a formula of ABCD parameters of the target device test structure, the reference device test structure and the cascade test structure in the two-port network interconnection theory, converting the calculated ABCD parameter of the target device test structure into its Y parameter, and calculating the third result value X3 of the test performance parameters by the relationship of the Y parameter of the target device test structure and the test performance parameters.

7. The method according to claim 6, wherein, the formula of ABCD parameters of the target device test structure, the reference device test structure and the cascade test structure in the Step S033 is $$\begin{bmatrix} A_{CAS} & B_{CAS} \\ C_{CAS} & D_{CAS} \end{bmatrix} = \begin{bmatrix} A_1 & B_1 \\ C_1 & D_1 \end{bmatrix} \begin{bmatrix} A_2 & B_2 \\ C_2 & D_2 \end{bmatrix}$$

wherein the subscript CAS indicates the cascade test structure, the subscript 1 indicates the target device test structure, and the subscript 2 indicates the reference device test structure.

8. The method according to claim 1, wherein, the Step S04 also includes that if the minimum error value is lower than the preset value, it is judged that the accuracy and the applicable frequency range of the RF device both are acceptable; if the minimum error value is higher than the preset value, it is judged that the accuracy and applicable frequency range of the RF device both are unacceptable.

9. The method according to claim 1, wherein, the auxiliary test structure D5 includes one or more of an open circuit test structure, a short circuit test structure and a through test structure corresponding to the de-embedding method, the target device test structure, the reference device test structure, the parallel test structure of the target device and the reference device, the cascade test structure of the target device and the reference device, and the auxiliary test structure all have a same basic structure with same signal input and output pads, grounded pads and metal leads.

10. The method according to claim 1, wherein, the target device or the reference device is one of a capacitor, an inductor, a resistor, and a transistor without external bias, respectively.

11. The method according to claim 1, wherein, the auxiliary test structure D5 includes one or more of an open circuit test structure, a short circuit test structure and a through test structure corresponding to the de-embedding method, the target device test structure, the reference device test structure, the parallel test structure of the target device and the reference device, the cascade test structure of the target device and the reference device, and the auxiliary test structure all have a same basic structure with same signal input and output pads, grounded pads and metal leads.

12. The method according to claim 1, wherein, the target device or the reference device is one of a capacitor, an inductor, a resistor, and a transistor without external bias, respectively.

* * * * *